United States Patent [19]

Chow

[11] Patent Number: 4,733,197

[45] Date of Patent: Mar. 22, 1988

[54] EXTENDED RANGE PHASELOCKED LOOP

[75] Inventor: Peter Chow, Nepean, Canada

[73] Assignee: Northern Telecom Limited, Montreal, Canada

[21] Appl. No.: 16,750

[22] Filed: Feb. 19, 1987

[51] Int. Cl.$^4$ .............................................. H03L 7/00
[52] U.S. Cl. .................................... 331/1 A; 331/20; 358/158
[58] Field of Search ...................... 331/1 A, 10, 16, 20, 331/25, 34; 455/258, 260, 265; 358/17, 158, 320

[56] References Cited

U.S. PATENT DOCUMENTS 4,600,895 7/1986 Landsman ......................... 331/20 X
4,649,438 3/1987 Shimizu et al. ................... 331/20 X

OTHER PUBLICATIONS

Oberst, "Generalized Phase Comparators for Improved Phase-Locked Loop Acquisition", IEEE Trans. on Com. Tech., vol. Com-19, No. 6, Dec. 1961, pp. 1142–1148.

Primary Examiner—Eugene R. Laroche
Assistant Examiner—Robert J. Pascal
Attorney, Agent, or Firm—Michael M. Sakovich

[57] ABSTRACT

An acquisition circuit in an improved phaselocked loop prevents cycle slipping by detecting and compensating an impending large phase difference between an independent incoming signal and a local comparison signal dependently related to a voltage controlled oscillator. A train of pulses is generated in progressively delayed phase relation with each cycle of the oscillator output signal. Additionally a threshold signal related to the independent signal is produced. In response to overlap of the threshold signal and individual ones of the pulses, a phase error signal is generated which controls a commutator to select individual ones of the pulses having a predetermined delay as the comparison signal, thereby generating a correcting control signal to phaselock the oscillator at a faster rate than the linear response time of a standard loop.

14 Claims, 6 Drawing Figures

EXTENDED RANGE PHASELOCKED LOOP

FIELD OF THE INVENTION

This invention relates to a phaselocked loop circuit and more particularly to a non-slip phaselocked loop with aided acquisition.

BACKGROUND OF THE INVENTION

Phaselocked loop (PLL) circuits have seen widespread use wherever there is a need to synchronize a local oscillator with an independent incoming signal. A notable application may be seen in the common use of PLLs in synchronizing horizontal and vertical scan circuits in television receivers. Accuracy of synchronization whereby each and every cycle of the oscillator output signal corresponds to a like independent input signal accounts for such popularity.

Picture synchronization in a television receiver is but one application of many in modern digital transmission systems in which digital signals are frequently regenerated and wherein clock signals must be produced in order to sample and retime a received pulse stream. Applications of this type are commonplace in telephony where synchronous operation is required between circuits located at opposite ends of a telephone line.

A pulse type PLL typically has a linear pull-in telephone line range of $2\pi$ radians in phase error. However, should the phase error exceed this range, the PLL will slip cycles causing an erratic operation that results in a pull-in time that is relatively long compared to the linear response time of the PLL. This problem is discussed in an article entitled, "Generalized Phase Comparators for Improved Phase-Locked Loop Acquisition", by James F. Oberst, in IEEE Transactions on Communication Technology, Vol. Com-19, No. 6, December 1971, which also describes various circuits useful in minimizing the cycle slipping problem. Although these circuits improve acquisition substantially, they do not eliminate the problem entirely and may slip a cycle before acquisition is attained.

SUMMARY OF THE INVENTION

A principal objective of the present invention is to provide a phaselocked loop circuit that prevents true phase error from exceeding $2\pi$ radians thereby overcoming the problem of cycle slipping.

Another provision of the invention is a phaselocked loop which includes an acquisition circuit that will function with any type of phase comparator.

Yet another provision of the invention is a phaselocked loop circuit that is relatively simple in design and therefore economical to manufacture.

The problem associated with the prior art may be substantially overcome and the foregoing objectives achieved by recourse to the present invention which, in one aspect, relates to a phaselocked loop circuit having a comparator adapted to generate a control signal proportional to a phase difference between an independent input signal and a local input signal dependently related to an output signal of a controllable oscillator, and filter means coupling the control signal to the oscillator for acquisition at a predetermined rate. The circuit comprises means for generating a threshold signal in predetermined phase relation with the independent signal, delay means operatively connected to the oscillator for generating a signal in progressively delayed phase relation with the oscillator output signal, detector means responsive to signal coincidence of the threshold signal and the delayed signal for generating a phase error signal, and commutator means controllably responsive to the phase error signal for selecting the delayed signal at a predetermined phase delay and applying the delayed signal to the local signal input for generating an enhanced control signal proportional to an increased phase difference between the input signals, thereby increasing the rate of acquisition to preempt cycle slipping.

Another aspect of the invention relates to a method for aided acquisition in a phaselocked loop circuit having a comparator adapted to generate a control signal proportional to a phase difference between an independent input signal and a local input signal dependently related to an output signal of a controllable oscillator, and filter means coupling the control signal to the oscillator for acquisition at a predetermined rate. The method coxprises the steps of, generating a threshold signal in predetermined phase relation with the independent signal, generating a signal in progressively delayed phase relation with the oscillator output signal, detecting coincidence of the threshold and delayed signals and generating a phase error signal in response thereto, and selecting the delayed signal at a predetermined phase delay in response to the phase error signal and applying the delayed signal to the local signal input for generating an enhanced control signal proportional to an increased phase difference between the input signals, thereby increasing the rate of acquisition to preempt cycle slipping.

BRIEF DESCRIPTION OF THE DRAWINGS

The invention will now be more particularly described with reference to an embodiment thereof shown, by way of example, in the accompanying drawings in which.

DESCRIPTION OF THE PREFERRED EMBODIMENT

Figure 1:
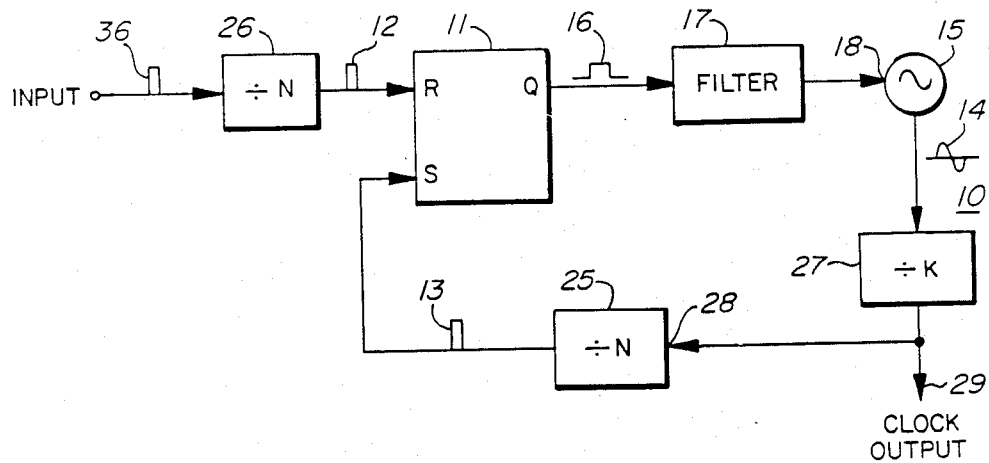
FIG. 1 is a block diagram of a standard phaselocked loop circuit that is known in the prior art.

FIG. 1 illustrates a known phaselocked loop circuit 10 as described in detail in the Oberst article which is incorporated herein by reference. The fundamental form of the circuit 10 includes a phase comparator shown as an R-S flip flop 11 having an input R to which is applied an independent input signal 12, an input S to which is applied a local signal 13 dependently related to an output signal 14 of a controllable oscillator 15, and an output Q which generates a control signal 16 that is proportional to a phase difference between signals applied to the inputs S and R.

A low-pass filter 17 is connected between the output Q and a control input 18 of the oscillator 15 for phase-locking the oscillator with the independent signal 12 appearing at the input R.

As noted by Oberst, the input signals at inputs R and S are formed into narrow pulse trains which alternately set and reset the flip flop 11. The control signal 16 output at Q is a rectangular pulse having a variable duty cycle with an average value dependent upon the relative phase of the signals at the inputs R and S. Thus, although the applied signal to the filter 17 is rectangular, the output therefrom has a sawtooth characteristic because the high-frequency coxponents of the output at Q are attenuated by the filtering characteristics of the filter 17. The signal output from the filter 17 is shown by an idealized open loop transfer function 19 curve in FIG. 3 and a signal 20 in FIG. 4d. The open loop means the filter output is not connected to the oscillator 15.

The flip flop 11 is known in the art as a pulse type phase comparator that exhibits a linear range of $2\pi$ radians in phase error. According to Oberst, the linear range of the circuit 10 is readily extendible by the addition of a divide-by-N counter 25 at the input S and a like counter 26 at the input R. This arrangement extends the linear range of the circuit 10 to $2\pi$ N radians since each counter gates every Nth input pulse to the flip flop 11.

A divide-by-K counter 27 couples the divided down output signal 14 from the oscillator 15 to an input 28 of the counter 25 from which a clock output 29 of the circuit 10 is also taken. The value of K is equal to a multiple by which the natural frequency of the oscillator 15 is greater than the frequency of the signal 12.

A local clock pulse signal (not shown) is produced at the output 29. Typically, this signal is used to clock a codec and other circuits (not shown) at a subscriber's telephone terminal for synchronous operation with a corresponding codec in a central office location.

The embodiment of the invention hereinbelow described relies on block diagrams to describe various circuit elements and their respective functions. These block diagrams represent individual circuits that would be known by those individuals skilled in the art to whom this specification is addressed, although not in the novel combination disclosed. The following description should therefore be sufficient to such individuals for a comprehensive understanding of the best mode contemplated to give effect to the embodiment as disclosed and claimed herein.

Figure 2:
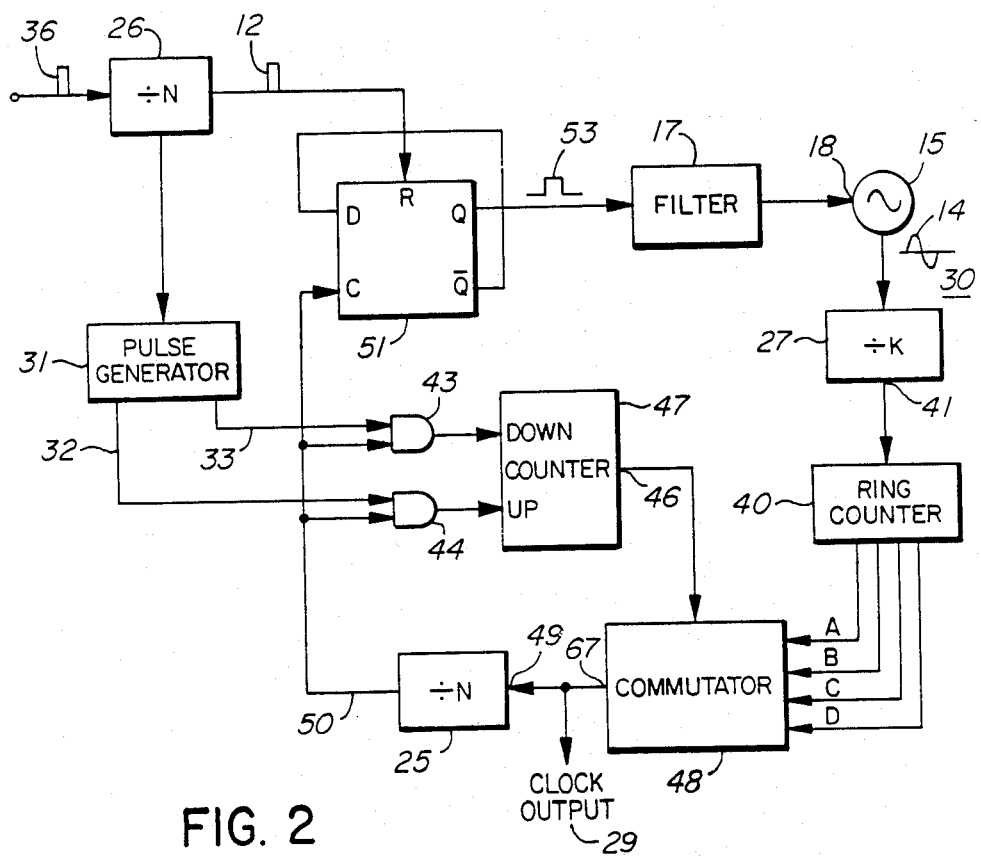
FIG. 2 is a block diagram of a phaselocked loop circuit in accordance with the present invention.

The known circuit 10 of FIG. 1 is embodied in the present invention which is illustrated in FIG. 2 as a non-slip phaselocked loop circuit 30. Like numbers are therefore used to identify like elements of the circuit 10 that appear in the circuit 30.

In addition to the aforenoted circuit elements, the circuit 30 includes a monostable flip flop 31 having outputs 32 and 33 for generating threshold signals 34 and 35 (FIGS. 5b and 5c) in predetermined phase relation with the incoming independent signal 12, counted down from a signal 36.

When input to the counter 26, the signal 36 may include substantial phase jitter as a result of changes in environmental conditions over the distances that the signal 36 is called upon to traverse. Where phase jitter exceeds $\pm\pi$, the circuit 10 would tend to slip cycles whereas the circuit 30 provides non-slip operation by virtue of an acquisition circuit that includes the flip flop 31 together with delay means shown as a four stage ring counter 40 that is connected to an output 41 of the counter 27 for generating a series of signals 42 in progressively delayed phase relation with the divided down oscillator output signal 14. As shown in FIGS. 5d–5g, the signals 42 comprise a plurality of sequential signals A, B, C, D that occur in successively delayed phase relation with the divided down oscillator output signal 14.

A pair of AND gates 43 and 44 function as detector means that are responsive to signal coincidence between the signals 34 and 35 and selected ones of the signals 42 for generating a phase error signal 45 which appears at an output 46 of an UP/DOWN counter 47 described in greater detail hereinbelow.

A commutator 48, described in greater detail hereinbelow, is controllably responsive to the signal 45 for selecting individual ones of the signals 42 in predetermined phase relation with the divided down oscillator output signal 14 and applying the selected signal to an input 49 of the counter 25, an output 50 of which is coupled to a toggle input C of a D type flip flop 51. It will be observed that selected ones of the signals 42 are also coupled to one input of each gate 43 and 44.

The signal 36 is divided by the counter 26 to produce a corresponding output signal 12 that is applied to a direct reset input R of the flip flop 51. The selected ones of the signals 42 are correspondingly divided by the counter 25 and are applied to the toggle input C as signals 52 (FIG. 5h). A control signal 53 (FIG. 5i) output at Q of the flip flop 51 is modified by the filter 17 to that of a slowly varying dc voltage signal 54 (FIG. 5j) which is coupled to the control input 18 of the oscillator 15 for phase locking same with the signal 36. In this regard, the signals 52 produce an enhancement of the signal 54 due to an artificially increased phase difference between the inputs C and R of the flip flop 51. This aspect of the circuit 30 will be better understood from the remarks which follow hereinbelow.

Typically, the signal 36 is applied to the input side of the counter 26 at a pulse rate of about 1.544 Mb/s. The counter 26 divides by a factor of 193 to produce the divided down reset signal to the flip flop 51 at a rate of 8 Kb/s.

With the input signal occurring at the rate stated, the natural free running frequency of the oscillator 15 will be 6.176 MHz which is divided down by a factor of four via the counter 27. The output of the counter 27 corresponds to the pulse rate of the signal 36 and is applied as a clock input to the counter 40 as shown.

Referring again to FIG. 5, it will be understood that the signals 42 comprise a cyclic pulse train consisting of pulses A, B, C, and D which are spaced equally over the duty cycle of the divided down oscillator output signal 14. FIGS. 5d–5g illustrate the progressively delayed phase relationship of the output pulses A, B, C and D over nine duty cycles of the divided down oscillator output signal.

Figure 3:
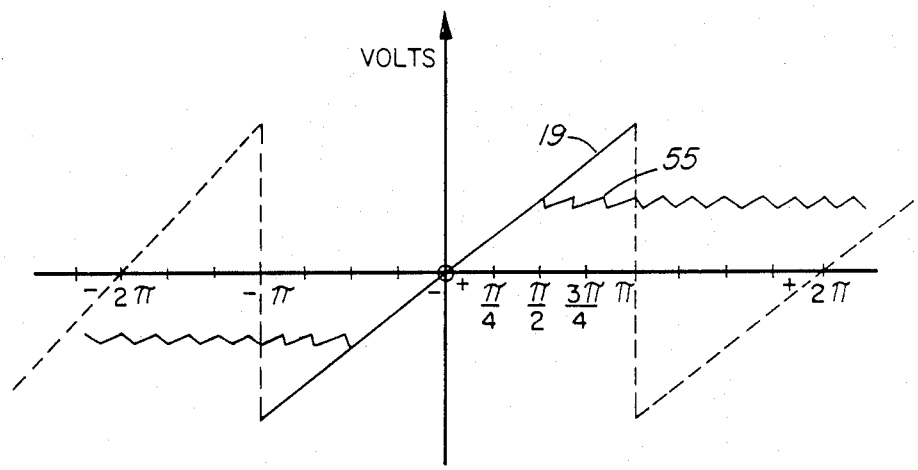
FIG. 3 is a diagram of a transfer function showing control voltage outputs of a phase comparator that appears in each one of the diagrams of FIGS. 1 and 2.

Reference to the transfer function diagram of FIG. 3 shows the signal 16 output of the flip flop 11 following modification of the signal 16 by the filter 17. The transfer function 19 is a typical sawtooth curve showing the relationship of control signal magnitude relative the phase difference between signals at the R and S inputs of the flip flop 11. The linear range of $2\pi$ radians in phase error is extended, as noted, by means of the counters 26 and 25 at respective ones of the R and S inputs.

Considering the lock range of $+\pi N$ and $-\pi N$ where N=193, the transfer function 19 illustrates the positive and negative magnitudes of the signal 16 relative corresponding positive and negative phase differences between the signals at the R and S inputs of the flip flop 11 in FIG. 1.

Figure 4:
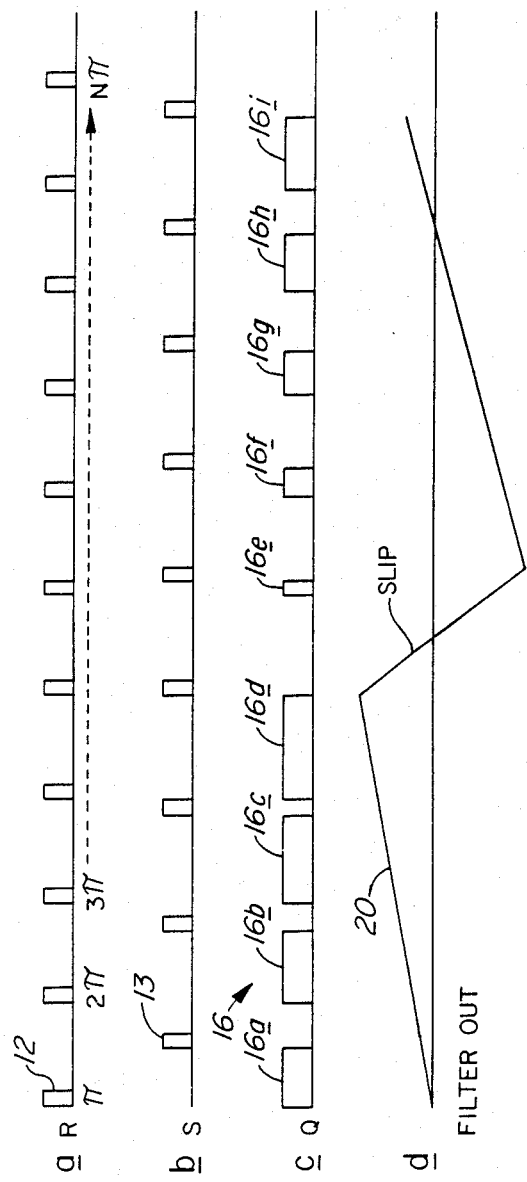
FIG. 4 is a timing diagram of signals occurring in the circuit of FIG. 1.

The problem of slipping cycles occurs when the phase difference of the signals at the inputs R and S exceeds $\pm N\pi$. At such extremes, the circuit 10 enters an acquisition mode wherein circuit operation becomes non-linear and requires substantial time to settle down. The problem becomes readily apparent upon examination of the waveforms illustrated in FIGS. 4a-4d. FIG. 4a is representative of the reset signal 12 appearing at the input R corresponding to the signal 36 whereas FIG. 4b illustrates set pulses 13 at the input S of the flip flop 11 which correspond to the output signal 14 of the oscillator 15. For descriptive purposes, the set pulses 13 are assumed to vary in phase between $\pi$ and $N\pi$ as shown. FIG. 4c thus shows a waveform 16a at the output Q of the flip flop 11 which represents a phase difference at the inputs R and S of $\pi/2$. A positive dc voltage that is applied to the control input 18 of the oscillator 15 appears as a corresponding portion of the signal 20. Similarly, FIG. 4c illustrates a waveform 16b representing a phase difference of $3\pi/4$ at the inputs R and S and a waveform 16c representing a phase difference of $3\pi/4+\Delta\pi$.

As the phase difference approaches the value $\pi$, the resulting waveform 16d produces a maximum positive amplitude in the signal 20. However, as the value $\pi$ is slightly exceeded, the waveform 16e suddenly shifts as illustrated, resulting in a polarity reversal of the signal 20. Thereafter, as the phase difference at the inputs R and S gradually increases to the value $\pi$, the resulting waveforms 16f-16i at the output Q of the flip flop 11, develop a positive going amplitude for the signal 20 as shown. It is this large and rapid shift in control voltage amplitude that occurs faster than the linear response time of the circuit 10 which results in cycle slipping. Phase differences in the region of $\pm\pi$ should therefore be avoided since phase jitter in the signal 36 may readily cause the phase difference to exceed $\pm\pi$ and cause cycle slipping.

FIG. 3 also shows a transfer function 55 of the circuit 30 which prevents cycle slipping entirely in accordance with the invention. It will be observed that the functions 19 and 55 coincide up to an arbitrarily selected phase difference shown as $\pm\pi/2$. At this point the function 55 changes from a linear to a non-linear function. This illustrates a corrective action taken by the circuit 30 to prevent cycle slipping by selecting predetermined ones of the pulses A, B, C and D and applying same to the input terminal C of the flip flop 51 so as to increase the apparent phase difference between the signals at the inputs C and R. As a result the average magnitude of the signal 54, referred to herein as an enhanced signal, is increased over that of the signal 20 which will pull the oscillator 15 into a phaselocked condition more rapidly, thus preventing the true phase difference of the signals at the inputs C and R from approaching the critical value of $\pm\pi$.

Figure 5:
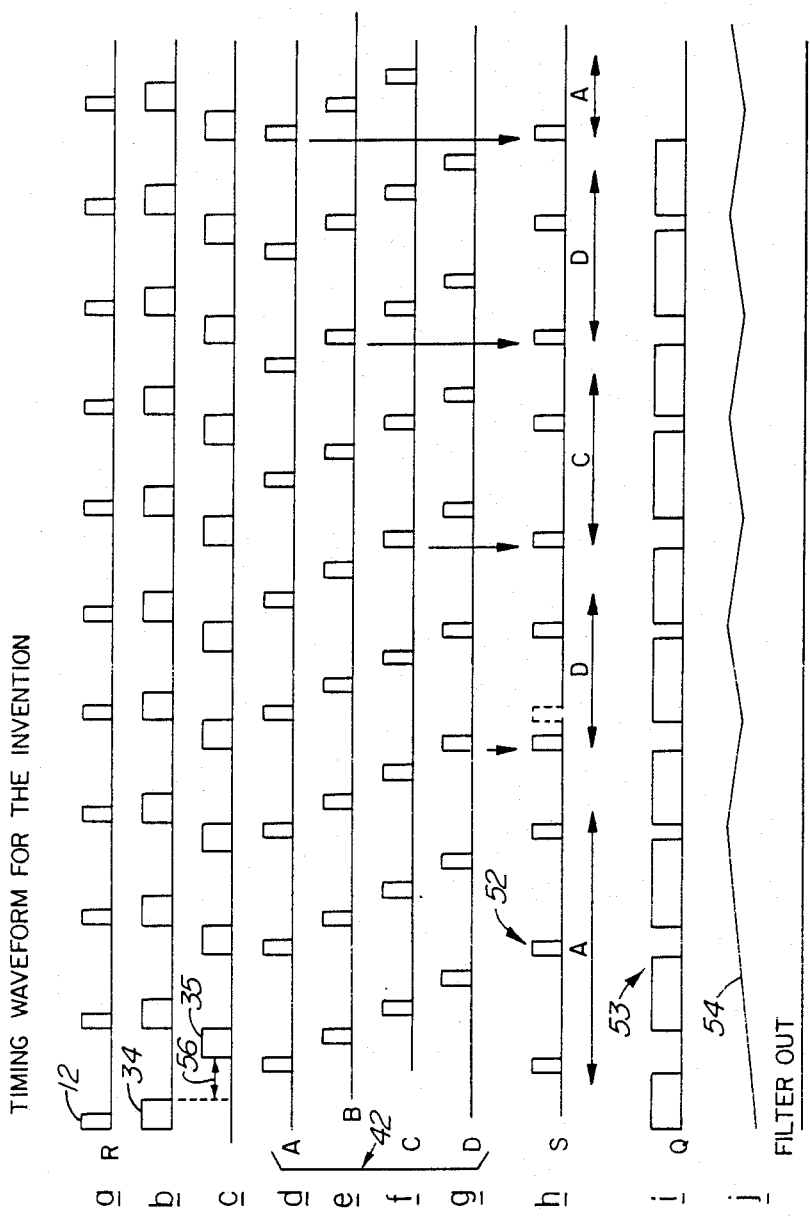
FIG. 5 is a timing diagram of signals occurring in the circuit of FIG. 2.

Selection of the appropriate pulse A, B, C or D is performed in response to the phase error signal 45 at the output 46, the generation of which depends upon coincidence of the threshold signals 34 and 35 and the divided down output signals 52 from the commutator 48. Reference to FIGS. 5b and 5c shows that the signals 34 and 35 coxprise a pair of pulses that occur over the duty cycle of the signal 12. Thus, the pulse 34 is coupled from one output 32 of the flip flop 31 to one input of the AND gate 44 whereas the second pulse 35 is coupled from the second output 33 of the flip flop to one input of the AND gate 43. As indicated in FIG. 5, it will be understood that the pulses 34 and 35 may be positioned over the aforenoted duty cycle to effect an adjustable spacing therebetween which is referred to herein as a window 56 (FIG. 4c). Coincidence or overlap of either pulse 34 or pulse 35 and the counted down output from the commutator 48 will result in a corresponding output from either AND gate 43 or 44 to actuate the counter 47.

Conversely, coincidence or overlap of the window 56 with the counted down output from the commutator 48 will leave the counter 47 unaffected such that its operating state and the resulting output signal 45 are unchanged. Correspondingly, the counted down output from the commutator 48 remains unchanged. Similarly, the phase of the signals 52 remains unchanged as well as the phase of the output signal from the oscillator 15. Under these conditions, the circuit 30 is in a phase-locked state.

Figure 6:
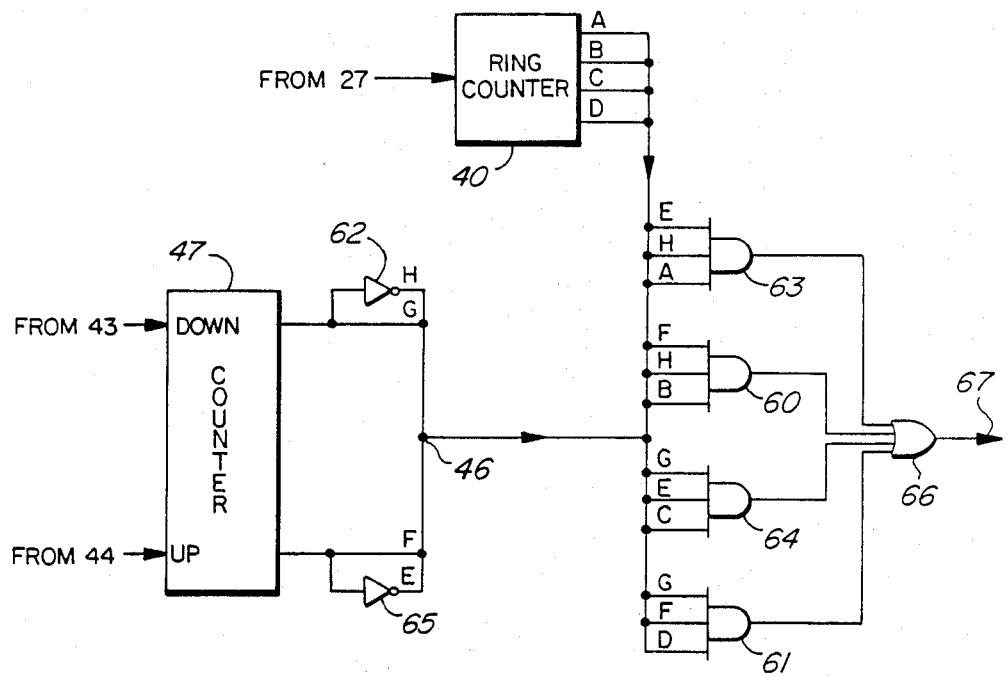
FIG. 6 is a detailed diagram of a commutator switch in accordance with the invention.

Assuming an out-of-lock condition in the circuit 30, the operation of the counter 47 and the commutator 48 will be better understood having regard to the waveforms of FIG. 5 and to the diagram of FIG. 6 showing the routing of the phase error signal 45 of the output 46.

Assuming signal overlap between the pulse 34 and the counted down output pulse selected from the pulses A, B, C and D by the commutator 48, the AND gate 44 generates a logical one output which is coupled to the incrementing input, shown as an up input of the counter 47. As may be seen in FIG. 6, a corresponding output F is shown connected to one input in AND gates 60 and 61 and inverted output E is produced by an inverter 65 and is connected to one input of AND gates 63 and 64.

Conversely, in the event of overlap between the pulse 35 and the counted down output from the commutator 48, a logical one from the AND gate 43 would be applied to the decrementing input, shown as a down input, of the counter 47 resulting in an output G together with an inverse output H generated by an inverter 62. The output G is shown connected to one input in AND gates 61 and 64 whereas the output H is shown connected to one input each of the AND gates 60 and 63.

The third input of each AND gate 60, 61, 63 and 64 has connected thereto a pulse output from the counter 40 which corresponds to one of the pulses A, B, C and D. As described above these pulses are connected to respective inputs in the AND gates 60, 61, 63 and 64 which produce outputs on a selective basis in response to the phase error signal at the output 46.

The aforenoted AND gates comprise a decoder portion of the commutator 48. An output from each of these AND gates is shown connected to a respective input of an OR gate 66 having an output 67 that is shown connected to the input 49 of the counter 25 in FIG. 2. Note that the clock output 29 is also taken from the output 67.

Selection of individual ones of the pulses A, B, C and D is responsive to the output 46 which represents the state of the counter 47. The relationship between the counter state and the selected pulse appears in the following table:

| Up-Down Counter State | Pulse Selected |
| --- | --- |
| 00 | A |
| 10 | B |
| 01 | C |

| Up-Down Counter State | Pulse Selected |
| --- | --- |
| 11 | D |

Under normal operation of the circuit 30, the counter 47 is quiescent and a divided down one of the pulses A, B, C and D is applied to the input C of the flip flop 51. Under normal operation, there is no functional difference between the circuits 10 and 30.

In the event of an abnormal operation as when a large positive phase jitter occurs in the signal 36, the jitter will cause overlap between the pulse 34 and the out-put pulses 52 from the counter 25. The counter 47 will accordingly increment before the phase difference $\pm\pi$ is reached. Each increment in the counter 47 will select a delayed pulse, e.g. A to B, B to C, C to D or D to A. As a result, the input terminal C of the flip flop 51 is delayed one clock (i.e. f/4) for each state change in the counter 47. This delay compensates the true input phase separation of the signals at inputs R and C of the flip flop 51 at a substantially more rapid rate than the linear response time of the circuit 10. Phase error is thereby reduced and as long as the signal applied to the input terminal C of the flip flop 51 occurs at a faster rate than the true phase change, cycle slip will not occur.

In the event of a large negative phase jitter occurring in the signal 36, the jitter will cause overlap between the pulse 35 and the output pulses 52 from the counter 25 causing the counter 47 to decrement. Each decrement in the counter 47 will select an advanced pulse, e.g. D to C, C to B, B to A or A to D. In this manner the C input of the flip flop 51 is advanced one clock (i.e. f/4) for each state change in the counter 47. This advancement compensates the true input phase difference occurring as a result of the jitter at a more rapid rate than that obtainable from the circuit 10. As in the case of the large positive phase jitter, the net result is a reduction in phase error without cycle slipping.

Although the foregoing embodiment of the invention has been disclosed in some detail, it will be understood by those individuals skilled in the art to whom this specification is addressed that various changes may be made without departing from the true spirit and scope of the invention. For example, whereas the embodiment has been described using a phase comparator that generates a pulse type output, it is equally feasible to employ a phase comparator having a sinusoidal output. The ring counter 40 is not necessarily limited to four stages and may in fact have a greater number of stages to provide a smoother progression of phase control by generating a cyclic pulse train having more than four pulses as described herein. It is apparent therefore that the invention is not limited to the embodiment disclosed but rather by the claims appended hereto.

The embodiments of the invention in which an exclusive property or privilege are claimed are defined as follows:

1. A phaselocked loop circuit having a comparator adapted to generate a control signal proportional to a phase difference between signals at a pair of inputs thereof to which are respectively coupled an independent input signal and a local input signal dependently related to an output signal of a controllable oscillator, and filter means coupling the control signal to the oscillator for acquisition at a predetermined rate, the circuit comprising:

means for generating a threshold signal in predetermined phase relation with the independent signal;

delay means operatively connected to the oscillator for generating a plurality of sequential signals in successively delayed phase relation with the oscillator output signal;

detector means responsive to coincidence of the threshold signal and the delayed signals for generating a phase error signal indicative of a predetermined phase difference between the independent and local input signals; and commutator means controllably responsive to the phase error signal for selecting individual ones of the delayed signals at a predetermined phase delay thereof and applying the delayed signals to the local signal input for generating an enhanced control signal proportional to an apparent increased phase difference between the independent and local input signals, thereby increasing the rate of acquisition to pre-empt concurrent cycle slipping of the controllable oscillator.

2. A circuit as claimed in claim 1 wherein the threshold signal generating means includes means for generating an adjustable window in the threshold signal.

3. A circuit as claimed in claim 2 wherein the threshold signal generator includes first and second outputs generating corresponding first and second pulses spaced in predetermined phase relation over the duty cycle of the independent signal to form the window.

4. A circuit as claimed in claim 3 wherein the sequential signals comprise a pulse train output of the commutator means occurring over the duty cycle of the oscillator output signal.

5. A circuit as claimed in claim 4 wherein the delay means comprises a ring counter triggerably responsive to the oscillator output signal for generating the pulse train, the ring counter including a plurality of outputs with each output generating a corresponding pulse of the pulse train.

6. A circuit as claimed in claim 5 wherein the detector means comprises:

counter means having an incrementing input, a decrementing input and an output for generating the phase error signal;

a first AND gate having one input coupled to the first output of the threshold signal generating means, a second input coupled to the pulse train output and an output coupled to the incrementing input of the counter; and a second AND gate having one input coupled to the second output of the threshold signal generating means, a second input coupled to the pulse train output and an output coupled to the decrementing input of the counter.

7. A circuit as claimed in claim 6 wherein the output of the counter means comprises a first output corresponding to an incrementing state and a second output corresponding to a decrementing state.

8. A circuit as claimed in claim 7 wherein the output of the counter means further comprises:

a first inverter having an input coupled to the first output of the counter means and an output inverting same; and a second inverter having an input coupled to the second output of the counter means and an output inverting same.

9. A circuit as claimed in claim 8 wherein the commutator means comprises:

a plurality of third AND gates corresponding to individual ones of pulses in the pulse train, each third AND gate having a first input coupled to a respective one of the incrementing outputs, a second input coupled to a respective one of the decrementing outputs, a third input coupled to a respective one of the pulse train outputs and an output; and OR gate means having separate inputs coupled to corresponding ones of outputs from the third AND gates and an output coupled to the second input of the first and second AND gates and to the local signal input of the comparator.

10. A circuit as claimed in claim 9, further comprising:
a first divide-by-N counter having an output coupled to an input of the comparator to which the independent input signal is applied and an input coupled to a source of independent input signals; and
a second divide-by-N counter having an output coupled to the local input of the comparator and the second inputs of the first and second AND gates, and an input coupled to the output of the OR gate means.

11. A circuit as claimed in claim 10, including the filter means which comprises a first order low pass filter.

12. A circuit as claimed in claim 11, further including the comaprator which comprises an R-S flip flop.

13. A circuit as claimed in claim 12 wherein the flip flop comprises a D type flip flop having a clock input to which the output of the first divide-by-N counter is coupled and a toggle input to which the output of the second divide-by-N counter is coupled.

14. A method for aided acquisition in a phaselock loop circuit having a comparator adapted to generate a control signal proportional to a phase difference between signals at a pair of inputs thereof to which are respectively coupled an independent input signal and a local input signal dependently related to an output signal of a controllable oscillator, and filter means coupling the control signal to the oscillator for acquisition at a predetermined rate, comprising the steps of:
generating a threshold signal in predetermined phase relation with the independent signal;
generating a plurality of sequential signals in successively delayed phase relation with the oscillator output signal;
detecting coincidence of the threshold and the delayed signals and generating a phase error signal in response thereto indicative of a predetermined phase difference between the independent and local input signals; and
selecting individual ones of the delayed signals at a predetermined phase delay thereof in response to the phase error signal and applying the delayed signals to the local signal input for generating an enhanced control signal proportional to an apparent increased phase difference between the independent and local input signals, thereby increasing the rate of acquisition to pre-empt concurrent cycle slipping of the controllable oscillator.

* * * * *